(12) United States Patent
Diao et al.

(10) Patent No.: US 9,396,963 B2
(45) Date of Patent: Jul. 19, 2016

(54) MASK REMOVAL PROCESS STRATEGY FOR VERTICAL NAND DEVICE

(71) Applicant: Mattson Technology, Inc., Fremont, CA (US)

(72) Inventors: Li Diao, Fremont, CA (US); HaiAu PhanVu, San Jose, CA (US); Vijay Matthew Vaniapura, Tracy, CA (US)

(73) Assignee: Mattson Technology, Fremont, CA (US)

( * ) Notice: Subject to any disclaimer, the term of this patent is extended or adjusted under 35 U.S.C. 154(b) by 0 days.

(21) Appl. No.: 14/532,030

(22) Filed: Nov. 4, 2014

(65) Prior Publication Data

US 2015/0126035 A1    May 7, 2015

Related U.S. Application Data

(60) Provisional application No. 61/900,425, filed on Nov. 6, 2013.

(51) Int. Cl.
| | | |
|---|---|---|
| *H01L 21/311* | (2006.01) | |
| *H01J 37/32* | (2006.01) | |
| *H01L 27/115* | (2006.01) | |

(52) U.S. Cl.
CPC ......... *H01L 21/31122* (2013.01); *H01J 37/321* (2013.01); *H01J 37/32357* (2013.01); *H01J 37/32422* (2013.01); *H01L 21/31144* (2013.01); *H01L 27/11563* (2013.01)

(58) Field of Classification Search
CPC ............. H01L 21/0206; H01L 21/31144; H01L 21/31122
See application file for complete search history.

(56) References Cited

U.S. PATENT DOCUMENTS

| | | | |
|---|---|---|---|
| 5,302,240 A | 4/1994 | Hori et al. | |
| 5,789,320 A | 8/1998 | Andricacos et al. | |
| 6,939,794 B2 | 9/2005 | Yin et al. | |
| 7,977,245 B2* | 7/2011 | Xiao | H01L 21/31116 257/E21.252 |
| 8,383,519 B2 | 2/2013 | Nozawa et al. | |
| 2003/0222319 A1* | 12/2003 | Azuma | H01L 29/41775 257/408 |
| 2004/0259355 A1* | 12/2004 | Yin | H01L 21/0332 438/689 |
| 2005/0042879 A1* | 2/2005 | Yin | H01L 21/0332 438/696 |
| 2005/0167394 A1* | 8/2005 | liu et al. | 216/41 |
| 2010/0210067 A1* | 8/2010 | Butcher | C23C 16/303 438/99 |
| 2014/0216498 A1* | 8/2014 | Lee et al. | 134/1.1 |

OTHER PUBLICATIONS

Abstract of Korean Patent—KR20120042045, May 3, 2012, 1 page.
(Continued)

*Primary Examiner* — Duy Deo
(74) *Attorney, Agent, or Firm* — Dority & Manning, P.A.

(57) ABSTRACT

A method for removing a doped amorphous carbon mask from a semiconductor substrate is disclosed. The method comprises generating a plasma to be used in treating the substrate, wherein the plasma comprises an oxygen containing gas, a halogen containing gas, and a hydrogen containing gas; and treating the substrate by exposing the substrate to the plasma. The doped amorphous carbon mask can be a boron doped amorphous carbon mask or a nitrogen doped amorphous carbon mask. The method can result in a mask removal rate ranging from about 1,000 Ångströms/minute to about 12,000 Ångströms/minute. Further, gases can be applied to the substrate before plasma treatment, after plasma treatment, or both to reduce the amount of defects or pinholes found in the substrate film.

21 Claims, 6 Drawing Sheets

(56) References Cited

OTHER PUBLICATIONS

International Search Report and Written Opinion for PCT/US2014/063786 dated Feb. 13, 2015, 12 pages.

Article—Lee et al., "A Novel SONOS Structure of $SiO_2/SiN/Al_2O_3$ with TaN Metal Gate for Multi-Giga Bit Flash Memeries," published in Electron Devices Meeting, 2003, IEDM '03 Technical Digest, IEEE International, Dec. 8-10, 2003, Washington DC, USA, 4 pages.

Article—Jang et al, "Vertical Cell Array Using TCAT (Terabit Cell Array Transistor) Technology for Ultra High Density NAND Flash Memory," published in VLSI Technology, 2009 Symposium, Jun. 16-18, 2009, Honolulu, HI, 2 pages.

* cited by examiner

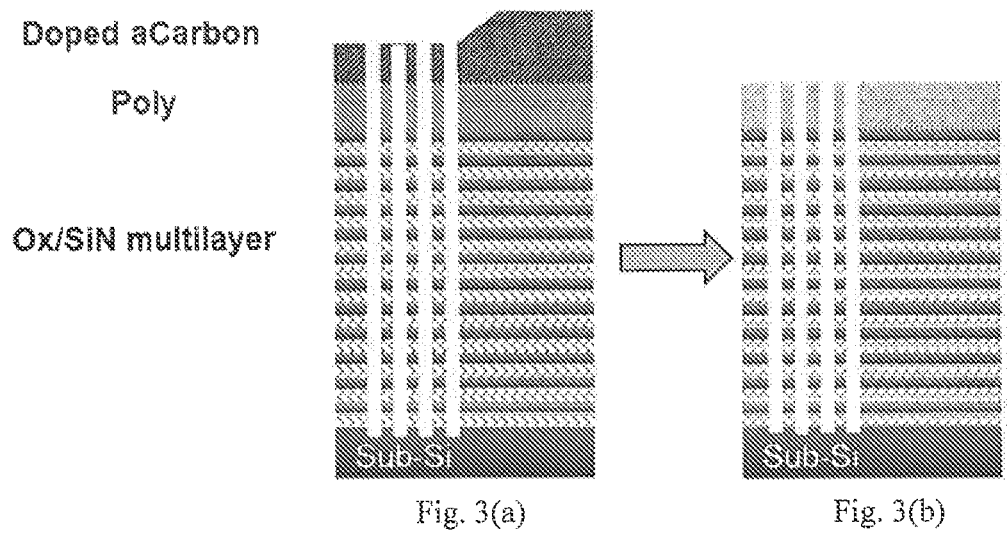
Fig. 3(a)    Fig. 3(b)
Fig. 3
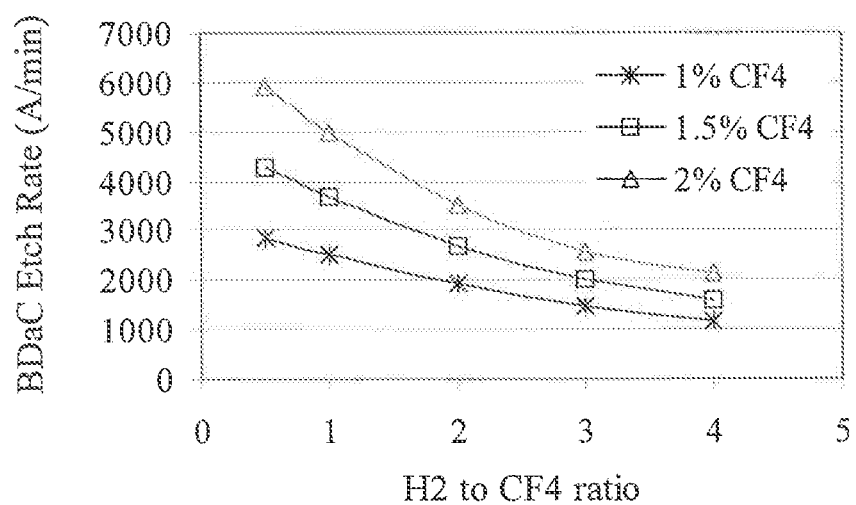
Fig. 4

MASK REMOVAL PROCESS STRATEGY FOR VERTICAL NAND DEVICE

RELATED APPLICATION

The present application claims priority to U.S. Provisional Application Ser. No. 61/900,425, filed on Nov. 6, 2013, which is incorporated herein in its entirety by reference thereto.

FIELD

The present disclosure relates generally to the removal of mask materials and, more particularly, to a process that can remove mask materials from semiconductor devices such as NAND devices.

BACKGROUND

In the semiconductor industry, NAND flash memory device development is aimed at increasing bit density while at the same time reducing bit cost. Recently, there has been an increase in interest in the use of vertical NAND flash memory cell arrays using terabit cell array transistor (TCAT) technology because of the technology's ability to utilize various advantages related to its metal gate silicon-oxide-nitride-oxide silicon (SONOS) cell structure. Such advantages include faster erase speed, wider Vth margin, and improved retention characteristics. With the SONOS structure, there can be more than 20 layers alternating between oxide and nitride in each vertical NAND stack, and, as a result, etching or stripping processes following word/line (W/L) cut etch can be very difficult due to the high aspect ratio (HAR) trenches that exist. To address this problem, new mask materials have been developed. One such group of new masking materials is doped amorphous carbon (DaC) films. However, with traditional strip processes, the mask removal rate of the DaC films has been less than about 500 Ångströms/minute, which is a removal rate that is much lower than the removal rate that can be reached with conventional amorphous carbon film using traditional strip processes.

As such, in order to make the use of DaC mask materials economically feasible, a need exists for much higher removal rates of the DaC than are currently available. A system and method that can preserve the critical dimensions (CD) and vertical profile of the trenches formed would be useful. A system and method that can reduce the loss of silicon nitride (SiN) and silicon oxide (SiOx) would be particularly useful.

SUMMARY

Aspects and advantages of the invention will be set forth in part in the following description, or may be obvious from the description, or may be learned through practice of the invention.

One exemplary aspect of the present disclosure is directed to a method for removing a doped amorphous carbon mask from a semiconductor substrate. The method comprises generating a plasma to be used in treating the substrate, wherein the plasma comprises an oxygen containing gas, a halogen containing gas, and a hydrogen containing gas; and treating the substrate by exposing the substrate to the plasma.

Another exemplary aspect of the present disclosure is directed to a method for removing a boron-doped amorphous carbon (BDaC) mask in a semiconductor device manufacturing process using any plasma generating apparatus or thermal apparatus. The BDaC etch process can use an oxygen containing chemistry, a fluorine containing chemistry, and a hydrogen containing chemistry. The fluorine containing chemistry can improve the etch rate, while the fluorine containing chemistry and the hydrogen containing chemistry can affect the overall etch rate of the BDaC and can affect the selectivity over oxide and nitride. Such a method can be performed at a temperature of about 50° C. or below.

Still another exemplary aspect of the present disclosure is directed to a method for improving the etch rate of a BDaC mask via a treatment that is performed before the etch process discussed in the preceding paragraph. Such a pre-treatment can be conducted using any plasma generating apparatus or thermal apparatus. Any chemistry can be utilized, such as an $O_2$ or $O_2/N_2$ based chemistry.

Yet another exemplary aspect of the present disclosure is directed to a treatment for improving etch selectivity over oxide and nitride where a single film exposed to a main etch process would yield a 1:1 ratio of oxide loss to nitride critical dimension (CD) loss. Such a treatment can include oxygen containing or nitrogen containing chemistry, including fluorine containing chemistry, using any plasma generating apparatus or thermal apparatus. This treatment can balance the oxidation rate or nitridation rate for both oxide and nitride layers so that the consumption rate of the substrate film is as close or similar as possible and so that the modified surface layers have similar thicknesses.

An additional exemplary aspect of the present disclosure is a pre-etch or post-etch treatment to help eliminate pinholes and other defects on a SiN layer developed with a doped amorphous carbon etching process. Such a treatment can be performed with oxygen containing, hydrogen containing, or nitrogen containing chemistry, with or without fluorine containing chemistry using any plasma generating apparatus or thermal apparatus.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which:

FIG. 3 shows a vertical NAND device after word/line (W/L) Cut Etch and before mask removal (FIG. 3(a)) and then after mask removal (FIG. 3(b));

FIG. 4 is a graph depicting the effect of the ratio of $H_2$ to $CF_4$ in a $O_2/H_2/CF_4$ plasma blend on the mask etch rate of boron-doped amorphous carbon (BDaC) when varying concentrations of $CF_4$ are used;

DETAILED DESCRIPTION

Figure 1:
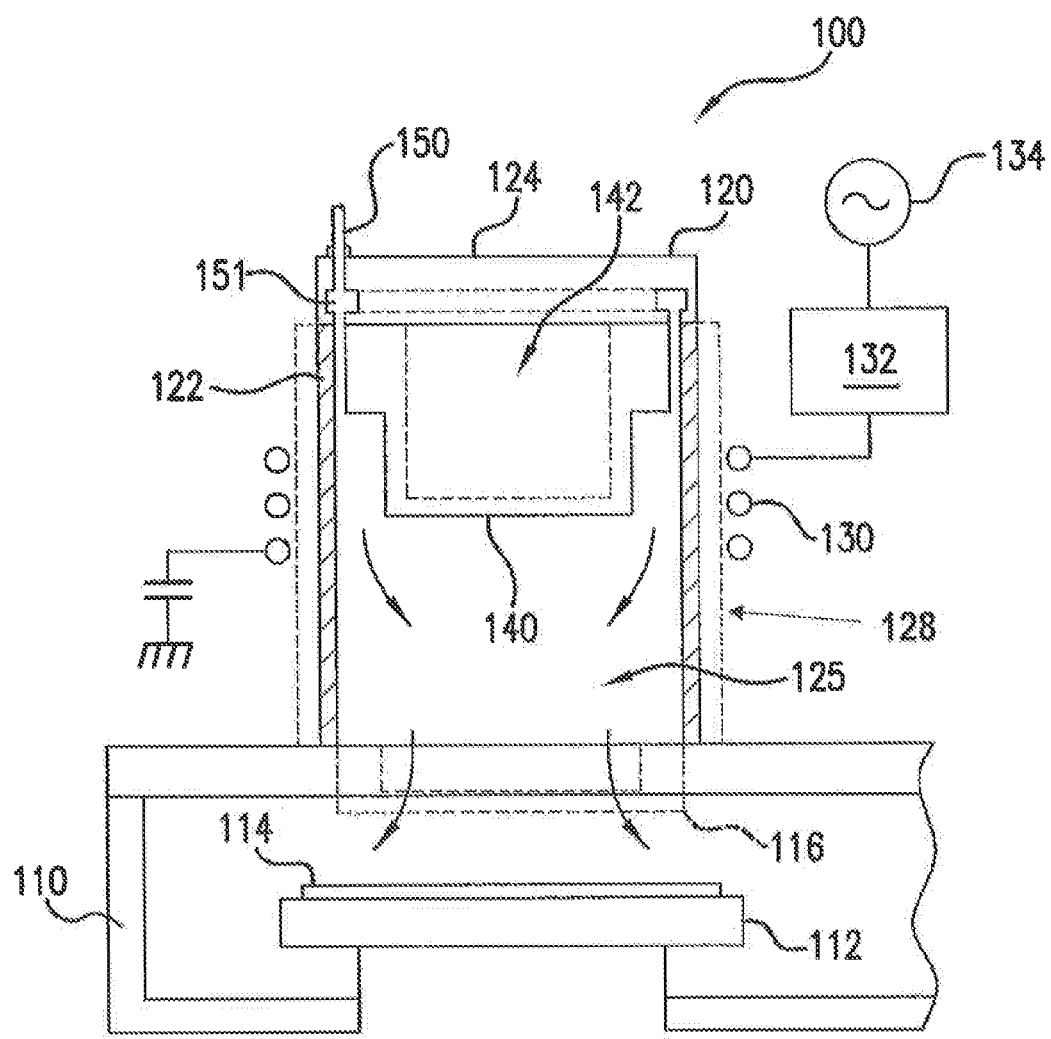
FIG. 1 depicts a plasma reactor that can be used in the exemplary methods according to aspects of the present disclosure.

Reference now will be made in detail to embodiments of the present disclosure, one or more examples of which are illustrated in the drawings. Each example is provided by way of explanation of the embodiments, not limitation of the embodiments. In fact, it will be apparent to those skilled in the art that various modifications and variations can be made in the embodiments without departing from the scope or spirit of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

Generally, example aspects of the present disclosure are directed to a method of removing a doped amorphous carbon mask from a semiconductor substrate using a plasma chemistry supplied via any plasma generating apparatus. A thermal apparatus can also be used. The present inventors have discovered that through the selective control of various processing parameters, mask removal rates ranging from about 1,000 Ångströms/minute to about 12,000 Ångströms per minute, such as from about 1,500 Ångströms/minute to about 10,000 Ångströms/minute, such as from about 2,000 Ångströms/minute to about 8,000 Ångströms/minute can be achieved when removing doped amorphous carbon (DaC) masks. For instance, one or more of the following parameters can be controlled to achieve the desired mask removal rate: the specific combination of gases, the concentration of each gas, the ratio of the concentration of one gas to the concentration of another gas, the gas flow rates, the etch temperature, the etch pressure, the source power, pre-treatment, or post-treatment.

In one particular embodiment, a downstream inductively coupled plasma (ICP) source can be utilized. However, the mask removal process of the present disclosure also contemplates other plasma technologies such as microwave downstream strip technology or parallel plate/inductively coupled plasma etch technologies. Inductive plasma sources are often used for plasma processing to produce high density plasma and reactive species for processing semiconductor substrates. For instance, inductive plasma sources can easily produce high density plasma using standard 13.56 MHz and lower frequency power generators. Inductive plasma sources combined with RF bias have also been used in etchers, for example, to provide independent control of ion energy and ion flux to the wafer.

For certain plasma processes such as mask removal, it is generally not desirable to expose the semiconductor wafers directly to the plasma. In this regard, the plasma can be formed remotely (e.g., downstream) from the processing chamber, after which the desired particles are channeled to the semiconductor substrate, for example, through a grid that is transparent to neutral particles and not transparent to the plasma. Such processes can require high RF power (e.g., up to about 6,000 watts (W)) and in some cases high gas flows (e.g., about 20,000 standard cubic centimeters per minute (sccm)) and high pressure (e.g., up to about 5,000 milliTorr (mTorr)).

FIG. 1 depicts a plasma reactor 100 that can be used in the processes embodied by the present disclosure. In some embodiments, the Mattson Suprema™ ICP reactor is utilized. This apparatus processes two 300 mm wafers in parallel, using a shared gas supply but individual RF power sources. However, other ICP sources would have similar flow and power requirements per wafer to achieve the same results. To first order, it is expected that parameters such as flow rate and RF power will scale with the surface area of the wafer, such that, for instance, a 450 mm wafer (1590 cm$^2$ area) requires 2.25 times the gas flow and power of a 300 mm wafer (707 cm$^2$ area), while a 200 mm wafer (314 cm$^2$ surface area), requires 0.44 times the flow and power of a 300 mm wafer (707 cm$^2$ surface area). Moreover, as the discussion below is specific to the Suprema system, it is to be understood that the stated gas flow rates are halved when operating in a system that supplies gas for one wafer instead of two wafers. Further, it is to be understood that substrates having any diameter, such as from about 100 mm to about 500 mm, can be treated via the method of the present disclosure. In addition, it is to be understood, based on the disclosures provided herein, that any other suitable reactor having an inductively coupled plasma source can also be utilized without deviating from the scope of the present disclosure. It is also to be understood that any other suitable plasma reactor can be utilized, as would be known by one having ordinary skill in the art, without deviating from the scope of the present disclosure, including but not limited to microwave technology or parallel plate technology. As illustrated, plasma reactor 100 includes a processing chamber 110 and a plasma chamber 120 that is separate from the processing chamber 110. The processing chamber 110 includes a substrate holder or pedestal 112 operable to hold a substrate 114 from which a mask is to be removed, such as a vertical NAND device. An inductive plasma is generated in plasma chamber 120 (i.e., plasma generation region) and desired particles are then channeled from the plasma chamber 120 to the surface of substrate 114 through holes provided in a grid 116 that separates the plasma chamber 120 from the processing chamber 110 (i.e., downstream region).

The plasma chamber 120 includes a dielectric side wall 122 and a ceiling 124. The dielectric side wall 122 and ceiling 124 define a plasma chamber interior 125. Dielectric side wall 122 can be formed from any dielectric material, such as quartz. An induction coil 130 is disposed adjacent the dielectric side wall 122 about the plasma chamber 120. The induction coil 130 is coupled to an RF power generator 134 through a suitable matching network 132. Reactant and carrier gases can be provided to the chamber interior from gas supply 150 and annular gas distribution channel 151. When the induction coil 130 is energized with RF power from the RF power generator 134, a substantially inductive plasma is induced in the plasma chamber 120. In a particular embodiment, the plasma reactor 100 can include an optional faraday shield 128 to reduce capacitive coupling of the induction coil 130 to the plasma.

To increase efficiency, the plasma reactor 100 can optionally include a gas injection insert 140 disposed in the chamber interior 125. The gas injection insert 140 can be removably inserted into the chamber interior 125 or can be a fixed part of the plasma chamber 120. In some embodiments, the gas injection insert can define a gas injection channel proximate the side wall of the plasma chamber. The gas injection channel can feed the process gas into the chamber interior proximate the induction coil and into an active region defined by the gas injection insert and side wall. The active region provides a confined region within the plasma chamber interior for active heating of electrons. The narrow gas injection channel prevents plasma spreading from the chamber interior into the gas channel. The gas injection insert forces the process gas to be passed through the active region where electrons are actively heated.

Regardless of the type of downstream inductively coupled plasma source utilized in the methods of the present disclosure, the present inventors have discovered that one or more plasma treatments with one or more plasma chemistries can be carried out on a semiconductor substrate such as a vertical NAND device to remove doped amorphous carbon mask materials from the substrate while at the same time maintaining the vertical profile of the trench and critical dimension (CD). The mask material can, for instance, be a boron-doped amorphous carbon film, a nitrogen-doped amorphous carbon film, or any other doped amorphous carbon film known to one having ordinary skill in the art.

Generally, the mask removal methods according to example methods of the present disclosure can be carried out on substrates that include high aspect ratio HAR trenches formed by alternating layers of oxide and nitride sandwiched between silicon. In some instances, the number of oxide and nitride layers in a vertical NAND device can be as high as 15 or more, such as about 20 to 25. A typical vertical NAND device that can be treated by the methods of the present disclosure is shown in FIG. 3. In other embodiments, the present disclosure describes an example method that includes a main plasma treatment to remove photoresist, which can be preceded by a pre-treatment, followed by a post-treatment, or both.

Regardless of the number and specific type of plasma treatments, the plasma used in removing a doped amorphous carbon mask from a substrate can include a mixture of an oxygen containing gas, a halogen containing gas, and a reducing gas that contains hydrogen. The oxygen containing gas can include but is not limited to carbon dioxide ($CO_2$), carbon monoxide (CO), nitrous oxide ($N_2O$), or combinations thereof. The halogen containing gas can include fluorine and can, in some embodiments, be represented by the formula $CH_xF_y$. In one embodiment, the halogen containing gas can be tetrafluoromethane ($CF_4$), although it is to be understood, using the disclosures provided herein, that any suitable halogen containing gas can be utilized as would be known to one having ordinary skill in the art. The reducing gas containing hydrogen can be molecular hydrogen ($H_2$), ammonia ($NH_3$), methane ($CH_4$), or a diluted gas mixture containing hydrogen. Dilution with an inert gas can also be used as part of the gas mixture. In certain embodiments, the inert gas can include nitrogen ($N_2$) or noble gases such as argon (Ar) or helium (He), or combinations thereof.

Regardless of the specific oxygen containing gas, halogen containing gas, or reducing gas utilized in example mask removal processes of the present disclosure, the halogen containing gas can be present in an amount that is from about 0.25% to about 4% of the total gas volume, such as from about 0.5% to about 3% of the total gas volume, such as from about 1% to about 2% of the total gas volume. Further, the ratio of the concentration of the hydrogen containing reducing gas to the halogen containing gas (such as the ratio of $H_2$ to $CF_4$) can be less than or equal to 1. In some embodiments, the ratio of the hydrogen containing gas to halogen containing gas ranges from about 0.001 to about 1, such as from about 0.002 to about 0.9, such as from about 0.005 to about 0.75.

The oxygen containing gas, halogen containing gas, and reducing gas (i.e., hydrogen containing gas) and optional inert gas can be introduced into the plasma generation chamber and processing chamber at various flow rates. For instance, when treating two substrates each having a diameter of about 300 mm, the oxygen containing gas can have a flow rate of from about 50 to about 20,000 sccm, such as from about 1,000 sccm to about 10,000 sccm, such as from about 3,000 sccm to about 8.000 sccm. Meanwhile, the halogen containing gas can have a flow rate of from about 10 sccm to about 400 sccm, such as from about 20 sccm to about 200 sccm, such as from about 30 sccm to about 160 sccm. Further, the hydrogen containing reducing gas can have a flow rate of from about 30 sccm to about 600 sccm, such as from about 50 sccm to about 400 sccm, such as from about 100 sccm to about 200 sccm. In addition, the inert gas can have a flow rate of from about 0 sccm to about 10,000 sccm, such as from about 10 sccm to about 8,000 sccm, such as from about 20 sccm to about 6,000 sccm.

Based on the surface area of the substrate (e.g., a single 300 mm diameter substrate having a surface area of about 706.5 centimeters squared ($cm^2$), this corresponds with an oxygen containing gas that can have a flow rate of from about 0.03 sccm per $cm^2$ to about 15 sccm per $cm^2$, such as from about 0.7 sccm per $cm^2$ to about 7.25 sccm per $cm^2$, such as from about 2 sccm per $cm^2$ to about 5.75 sccm per $cm^2$. Meanwhile, this corresponds with a halogen containing gas that can have a flow rate of from about 0.007 sccm per $cm^2$ to about 0.3 sccm per $cm^2$, such as from about 0.014 sccm per $cm^2$ to about 0.15 sccm per $cm^2$, such as from about 0.02 sccm per $cm^2$ to about 0.12 sccm per $cm^2$. Further, this corresponds with a hydrogen containing reducing gas that can have a flow rate of from about 0.02 sccm per $cm^2$ to about 0.5 sccm per $cm^2$, such as from about 0.035 sccm per $cm^2$ to about 0.3 sccm per $cm^2$, such as from 0.07 sccm per $cm^2$ to about 0.15 sccm per $cm^2$. In addition, this corresponds with an inert gas that can have a flow rate of from about 0 sccm per $cm^2$ to about 7 sccm per $cm^2$, such as from about 0.007 sccm per $cm^2$ to about 5.75 sccm per $cm^2$, such as from about 0.014 sccm per $cm^2$ to about 4.25 sccm per $cm^2$.

Further, mask removal can be carried out at varying temperature, power, and pressure levels. For example, the temperature during mask removal can range from about 5° C. to about 300° C., such as from about 10° C. to about 150° C., such as from about 15° C. to about 50° C. Additionally, it is to be understood that the substrate to be treated can be preheated, either under vacuum, an atmospheric heat soak, or a lamp base preheat. Additionally, the RF source power for treating 300 mm diameter substrates can range from about 300 W to about 6,000 W, such as from about 1,000 W to about 5,500 W, such as from about 3,000 W to about 5,000 W. Meanwhile, it is to be understood that the source power can be adjusted up or down based on the surface area of the substrate to be treated in the same manner as discussed above for gas flow rates. Thus, for example, when treating a substrate ranging from about 100 mm to about 500 mm in diameter, such as from about 200 mm to about 450 mm in diameter, the source power can range from about 125 W to about 13,500 W, such as from about 425 W to about 12,375 W, such as from about 1,300 W to about 11,250 W.

Moreover, mask removal can be carried out at varying pressures. For instance, the pressure can range from about 1 mTorr to about 4,000 mTorr, such as from about 250 mTorr to about 1,500 mTorr, such as from about 400 mTorr to about 600 mTorr.

In addition, during mask removal, the substrate from which the doped amorphous carbon mask is to be removed can be treated for a specified time based on the CD and aspect ratio of the trenches or channels in the substrate to be treated. For instance, the processing time can range from about 1 second to about 600 seconds, such as from about 5 seconds to about 450 seconds, such as from about 10 seconds to about 300 seconds.

The mask removal process of the present disclosure can be more selective for BDaC than for the silicon nitride or silicon dioxide components of the substrate. For instance, the processes of the present disclosure can remove from about 100 times to about 400 times more BDaC than silicon nitride, such as from about 125 times to about 350 times more BDaC than silicon nitride, such as from about 125 times to about 300 times more BDaC than silicon nitride. Further, when the ratio of $H_2$ to $CF_4$ is about 1 or less, the processes of the present disclosure can remove at least about 200 times more BDaC than silicon nitride, such as from about 200 times to about 300 times more BDaC than silicon nitride. Moreover, the processes of the present disclosure can remove from about 100 times to about 1200 times more BDaC than silicon dioxide, such as from about 125 times to about 1150 times more BDaC than silicon dioxide, such as from about 150 times to about 1100 times more BDaC than silicon dioxide. Also, when the ratio of $H_2$ to $CF_4$ is about 1 or less, the processes of the present disclosure can remove at least about 200 times more BDaC than silicon dioxide, such as from about 200 times to about 800 times more BDaC than silicon dioxide.

Although not required, a substrate from which a doped amorphous carbon mask is to be removed can undergo a pre-treatment before the mask removal plasma treatment to further improve the etch rate of doped amorphous carbon mask. For instance, in some embodiments, performing a pre-treatment before conducting the mask removal process steps discussed above can increase the doped amorphous carbon etch rate by an amount ranging from about 150% to about 300%, such as from about 175% to about 275%, such as from about 200% to about 250%. For instance, an etch rate of 2000 Ångströms/minute can be increased to an etch rate of 6000-7000 Ångströms/minute by subjecting the substrate to a pre-treatment step. Such a pre-treatment can also be utilized to improve etch selectivity over oxide and nitride in the SONGS stack. As a result, a single film exposed to a main etching/mask removal process could exhibit a ratio of oxide to nitride critical dimension (CD) loss ranging from about 0.75 to about 1.25, such as from about 0.8 to about 1.2, such as from about 0.9 to about 1.1, such as about 1. Without intending to be limited by any particular theory, it is believed that the specific interaction of the gas chemistries utilized during the pre-treatment with the substrate can reduce the difference in selectivity between oxide and nitride when oxygen, halogen, and hydrogen containing gases are utilized during the main treatment/mask removal step. In addition, such treatments can also reduce the number of defects, such as pinholes, in the silicon nitride (SiN) film after mask removal. Further, a post-treatment step utilizing the same gases as discussed above for the pre-treatment step can also reduce pinhole formation in the substrate film.

Regardless of whether a substrate is exposed to an additional plasma chemistry as part of a pre-treatment step, a post-treatment step, or both, the treatment conditions can be as follows. First, the pre-treatment or post-treatment can be plasma or thermally enabled, and the particular gas or gases to utilize during the pre-treatment or post-treatment can depend on the etch process used prior to mask removal. For instance, the gases to be utilized can include oxygen-containing gases (such as $O_2$, $CO_2$, CO, $N_2O$, etc.), inert gases (such as Ar, He, $N_2$, etc.), reducing gases containing hydrogen ($H_2$, $N_2/H_2$ ("forming gas"), $NH_3$, etc.), and combinations thereof in either the pre-treatment step, post-treatment step, or both, and can also include halogen gases such as fluorine. Further, the gases can have a flow rate of from about 50 sccm to about 20,000 sccm, such as from about 1,000 sccm to about 15,000 sccm, such as from about 6,000 sccm to about 12,000 sccm when treating two substrates each having a diameter of about 300 mm.

Based on the surface area of the substrate (e.g., a single 300 mm diameter substrate having a surface area of about 706.5 centimeters squared ($cm^2$)), this corresponds with pre-treatment and post-treatment gases that can each have a flow rate of from about 0.03 sccm per $cm^2$ to about 15 sccm per $cm^2$, such as from about 0.70 sccm per $cm^2$ to about 10.75 sccm per $cm^2$, such as from about 425 sccm per $cm^2$ to about 8.5 sccm per $cm^2$.

More specifically, when the mask removal treatment includes an oxygen containing gas, a halogen containing gas, and a hydrogen containing gas, the pre-treatment and/or post-treatment plasma chemistry can include $O_2$ or a combination of $O_2$ and $N_2$ or $N_2/H_2$. By utilizing $O_2$ in a pre-treatment step before mask removal or a combination of $O_2$ in a pre-treatment step before mask removal and an $N_2$-containing gas in a post-treatment step after mask removal, a silicon oxy-nitride (SiON) surface layer can be formed on the substrate, and the present inventors have found that the silicon dioxide ($SiO_2$) and silicon nitride (SiN) etch rates can be matched at about a 1 to 1 ratio so that the same CD loss is maintained across the oxide and nitride layers.

When using a downstream inductively coupled plasma source to carry out the pre-treatment and/or post-treatment steps, varying temperature, power, and pressure levels can be selected. For example, the temperature can range from about 15° C. to about 300° C., such as from about 20° C. to about 290° C., such as from about 25° C. to about 275° C. Additionally, the RF source power can range from about 300 W to about 6,000 W, such as from about 1,000 W to about 5,500 W, such as from about 1,500 W to about 5,000 W when treating 300 mm substrates. Moreover, the pre-treatment and/or post-treatment steps can be conducted at varying pressures. For instance, the pressure can range from about 1 mTorr to about 4,000 mTorr, such as from about 200 mTorr to about 2,000 mTorr, such as from about 400 mTorr to about 1,000 mTorr.

In addition, during mask removal, the substrate from which the doped amorphous carbon mask is to be removed can be treated for a specified time based on the CD and aspect ratio of the trenches or channels in the substrate to be treated. For instance, the processing time can range from about 1 second to about 600 seconds, such as from about 5 seconds to about 450 seconds, such as from about 10 seconds to about 300 seconds.

Figure 2:
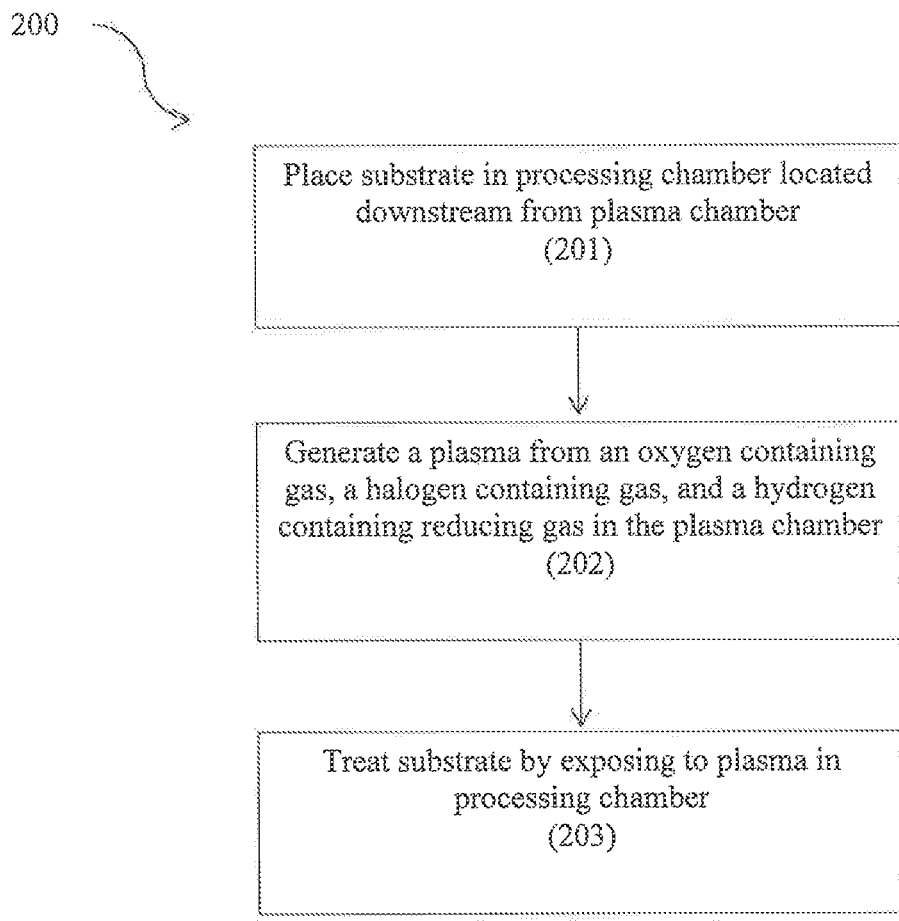
FIG. 2 depicts a flow diagram of a method for removing a mask from a semiconductor device according to an exemplary embodiment of the present disclosure.

The methods by which a doped amorphous carbon mask substrate can be removed and/or subjected to pre-treatment and/or post-treatment steps can be carried out in the plasma reactor discussed above in reference to FIG. 1 or with any other suitable plasma reactor. As shown in the block diagram of FIG. 2, a method 200 for mask removal from a semiconductor substrate can include placing a substrate in a processing chamber of a plasma reactor that is located downstream from a plasma chamber (201), generating a plasma from an oxygen containing gas, a halogen containing gas, and a reducing gas containing hydrogen (202), and treating the substrate by exposing the substrate to the plasma in the processing chamber (203). The plasma can include from about 0.25% to about 4% of the halogen containing gas based on the total gas volume, and the ratio of the hydrogen containing gas to the halogen containing gas can range from about 0.001 to about 1. Further, the oxygen containing gas can have a flow rate of from about 50 sccm to about 20,000 sccm, the halogen containing gas can have a flow rate of from about 10 sccm to about 400 sccm, and the hydrogen containing gas can have a flow rate of from about 30 sccm to about 600 sccm when treating two substrates each having a diameter of about 300 mm. Further, the sccm per $cm^2$ flow rates discussed above can be used to determine the flow rate when a substrate having a different diameter is to be treated.

Aspects of the present disclosure may be better understood by reference to the following examples, which refer to FIGS. 4-9 and demonstrate the effectiveness of mask removal methods discussed above.

Example 1

Example 1 refers to FIGS. 4-8. Fifteen SONOS substrates containing a boron-doped amorphous carbon mask layer were placed in a processing chamber, after which each substrate was treated with plasma formed in a plasma generation chamber. The plasma used to treat the substrates included $O_2$, $CF_4$, and $H_2$ gases. To see the effect of various processing conditions on the etch rate of the boron-doped amorphous carbon (BDaC) layer, silicon nitride, and silicon dioxide, the percentage of $CF_4$ in the plasma was adjusted to 1%, 1.5%, or 2% of the total gas volume, and the ratio of the percentage of $H_2$ gas to the percentage of $CF_4$ gas was adjusted to 0.5, 1, 2, 3, or 4. Then, the etch rate of the BDaC layer, silicon nitride, and silicon dioxide were determined. Next, the BDaC to silicon nitride selectivity and BDaC to silicon dioxide selectivity were calculated for each processing condition. The results are shown in FIGS. 4-8.

First, as shown in FIG. 4, the etch rate of the boron-doped amorphous carbon mask layer was determined for each of the varying conditions. When the percentage of $CF_4$ gas was increased, the BDaC etch rate also increased. Additionally, the BDaC etch rate was increased when the ratio of $H_2$ to $CF_4$ was decreased. For instance, when the $H_2$ to $CF_4$ ratio was 0.5 and 2% $CF_4$ gas was utilized, the etch rate was as high as about 6000 Ångströms/minute. Meanwhile, when the $H_2$ to $CF_4$ ratio was 0.5 and 1.5% $CF_4$ gas was utilized, the etch rate was about 4250 Ångströms/minute, and when the $H_2$ to $CF_4$ ratio was 0.5 and 1% $CF_4$ gas was utilized, the etch rate was about 2900 Ångströms/minute. Next, when the $H_2$ to $CF_4$ ratio was 1 and 2% $CF_4$ gas was utilized, the etch rate about 5000 Ångströms/minute. Meanwhile, when the $H_2$ to $CF_4$ ratio was 1 and 1.5% $CF_4$ gas was utilized, the etch rate was about 3750 Ångströms/minute, and when the $H_2$ to $CF_4$ ratio was 1 and 1% $CF_4$ gas was utilized, the etch rate was about 2500 Ångströms/minute. Then, when the $H_2$ to $CF_4$ ratio was 2 and 2% $CF_4$ gas was utilized, the etch rate was about 3750 Ångströms/minute. Meanwhile, when the $H_2$ to $CF_4$ ratio was 2 and 1.5% $CF_4$ gas was utilized, the etch rate was about 2750 Ångströms/minute, and when the $H_2$ to $CF_4$ ratio was 2 and 1% $CF_4$ gas was utilized, the etch rate was about 2000 Ångströms/minute. Further, when the $H_2$ to $CF_4$ ratio was 3 and 2% $CF_4$ gas was utilized, the etch rate about 2750 Ångströms/minute. Meanwhile, when the $H_2$ to $CF_4$ ratio was 3 and 1.5% $CF_4$ gas was utilized, the etch rate was about 2250 Ångströms/minute, and when the $H_2$ to $CF_4$ ratio was 3 and 1% $CF_4$ gas was utilized, the etch rate was about 1500 Ångströms/minute. Next, when the $H_2$ to $CF_4$ ratio was 4 and 2% $CF_4$ gas was utilized, the etch rate was about 2250 Ångströms/minute. Then, when the $H_2$ to $CF_4$ ratio was 4 and 1.5% $CF_4$ gas was utilized, the etch rate was about 1750 Ångströms/minute, and when the $H_2$ to $CF_4$ ratio was 4 and 1% $CF_4$ gas was utilized, the etch rate was about 1250 Ångströms/minute.

Figure 5:
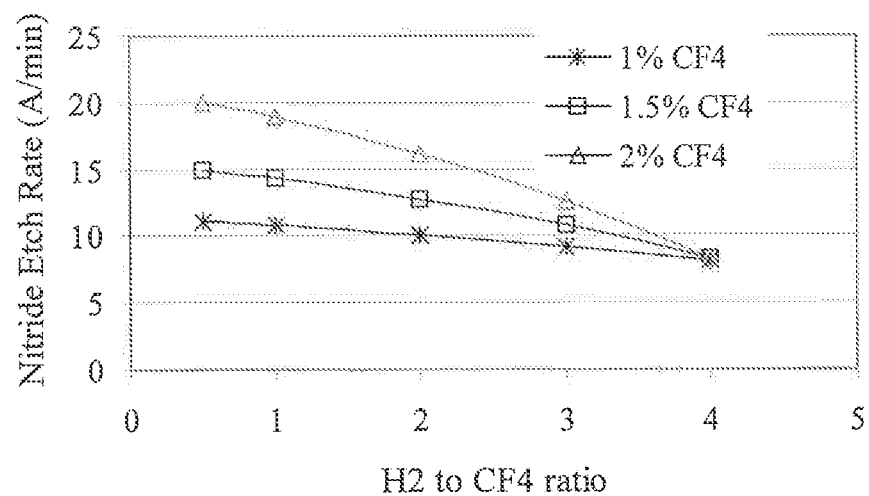
FIG. 5 is a graph depicting the effect of the ratio of $H_2$ to $CF_4$ in a $O_2/H_2/CF_4$ plasma blend on the etch rate of silicon nitride when varying concentrations of $CF_4$ are used.

Next, as shown in FIG. 5, the etch rate of silicon nitride was determined for each of the varying conditions. When the percentage of $CF_4$ gas was increased, the nitride etch rate also increased. Additionally, the nitride etch rate was increased when the ratio of $H_2$ to $CF_4$ was decreased. For instance, when the $H_2$ to $CF_4$ ratio was 0.5 and 2% $CF_4$ gas was utilized, the etch rate was about 20 Ångströms/minute. Meanwhile, when the $H_2$ to $CF_4$ ratio was 0.5 and 1.5% $CF_4$ gas was utilized, the etch rate was about 15 Ångströms/minute, and when the $H_2$ to $CF_4$ ratio was 0.5 and 1% $CF_4$ gas was utilized, the etch rate was about 11 Ångströms/minute. Next, when the $H_2$ to $CF_4$ ratio was 1 and 2% $CF_4$ gas was utilized, the etch rate about 19 Ångströms/minute. Meanwhile, when the $H_2$ to $CF_4$ ratio was 1 and 1.5% $CF_4$ gas was utilized, the etch rate was about 14.5 Ångströms/minute, and when the $H_2$ to $CF_4$ ratio was 1 and 1% $CF_4$ gas was utilized, the etch rate was about 10.5 Ångströms/minute. Then, when the $H_2$ to $CF_4$ ratio was 2 and 2% $CF_4$ gas was utilized, the etch rate was about 17 Ångströms/minute. Meanwhile, when the $H_2$ to $CF_4$ ratio was 2 and 1.5& $CF_4$ gas was utilized, the etch rate was about 13 Ångströms/minute, and when the $H_2$ to $CF_4$ ratio was 2 and 1% $CF_4$ gas was utilized, the etch rate was about 10 Ångströms/minute. Further, when the $H_2$ to $CF_4$ ratio was 3 and 2% $CF_4$ gas was utilized, the etch rate about 14 Ångströms/minute. Then, when the $H_2$ to $CF_4$ ratio was 3 and 1.5% $CF_4$ gas was utilized, the etch rate was about 2250 Ångströms/minute, and when the $H_2$ to $CF_4$ ratio was 3 and 1% $CF_4$ gas was utilized, the etch rate was about 9 Ångströms/minute. Meanwhile, when the $H_2$ to $CF_4$ ratio was 4 and 2% $CF_4$ gas was utilized, the etch rate was about 8 Ångströms/minute. Next, when the $H_2$ to $CF_4$ ratio was 4 and 1.5% $CF_4$ gas was utilized, the etch rate was also about 8 Ångströms/minute, and when the $H_2$ to $CF_4$ ratio was 4 and 1% $CF_4$ gas was utilized, the etch rate was about 8 Ångströms/minute as well.

Figure 6:
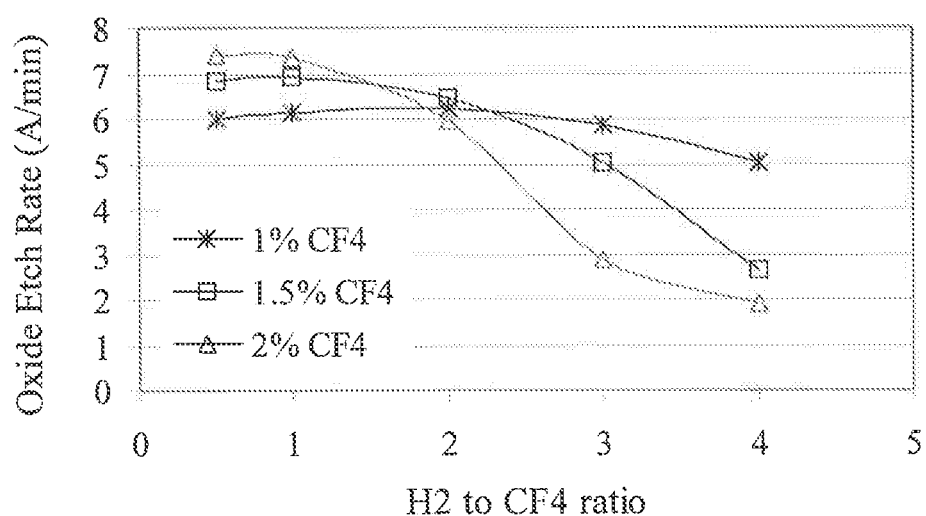
FIG. 6 is a graph depicting the effect of the ratio of $H_2$ to $CF_4$ in a $O_2/H_2/CF_4$ plasma blend on the etch rate of silicon oxide when varying concentrations of $CF_4$ are used.

Then, as shown in FIG. 6, the etch rate of silicon dioxide was determined for each of the varying conditions. When the ratio of $H_2$ to $CF_4$ was less than about 2 and the percentage of $CF_4$ gas was increased, the oxide etch rate increased. However, when the ratio of $H_2$ to $CF_4$ was greater than about 2 and the percentage of $CF_4$ gas was increased, the oxide etch rate decreased. For instance, when the $H_2$ to $CF_4$ ratio was 0.5 and 2% $CF_4$ gas was utilized, the etch rate was about 7.5 Ångströms/minute. Meanwhile, when the $H_2$ to $CF_4$ ratio was 0.5 and 1.5% $CF_4$ gas was utilized, the etch rate was about 6.8 Ångströms/minute, and when the $H_2$ to $CF_4$ ratio was 0.5 and 1% $CF_4$ gas was utilized, the etch rate was about 6 Ångströms/minute. Next, when the $H_2$ to $CF_4$ ratio was 1 and 2% $CF_4$ gas was utilized, the etch rate about 7.25 Ångströms/minute. Meanwhile, when the $H_2$ to $CF_4$ ratio was 1 and 1.5% $CF_4$ gas was utilized, the etch rate was about 7 Ångströms/minute, and when the $H_2$ to $CF_4$ ratio was 1 and 1% $CF_4$ gas was utilized, the etch rate was about 6.1 Ångströms/minute. Then, when the $H_2$ to $CF_4$ ratio was 2 and 2% $CF_4$ gas was utilized, the etch rate was about 6 Ångströms/minute. Meanwhile, when the $H_2$ to $CF_4$ ratio was 2 and 1.5% $CF_4$ gas was utilized, the etch rate was about 6.5 Ångströms/minute, and when the $H_2$ to $CF_4$ ratio was 2 and 1% $CF_4$ gas was utilized, the etch rate was about 6.25 Ångströms/minute. Further, when the $H_2$ to $CF_4$ ratio was 3 and 2% $CF_4$ gas was utilized, the etch rate about 3 Ångströms/minute. Then, when the $H_2$ to $CF_4$ ratio was 3 and 1.5% $CF_4$ gas was utilized, the etch rate was about 5 Ångströms/minute, and when the $H_2$ to $CF_4$ ratio was 3 and 1% $CF_4$ gas was utilized, the etch rate was about 5.9 Ångströms/minute. Meanwhile, when the $H_2$ to $CF_4$ ratio was 4 and 2% $CF_4$ gas was utilized, the etch rate was about 2 Ångströms/minute. Next, when the $H_2$ to $CF_4$ ratio was 4 and 1.5% $CF_4$ gas was utilized, the etch rate was about 2.5 Ångströms/minute, and when the $H_2$ to $CF_4$ ratio was 4 and 1% $CF_4$ gas was utilized, the etch rate was about 5 Ångströms/minute.

Figure 7:
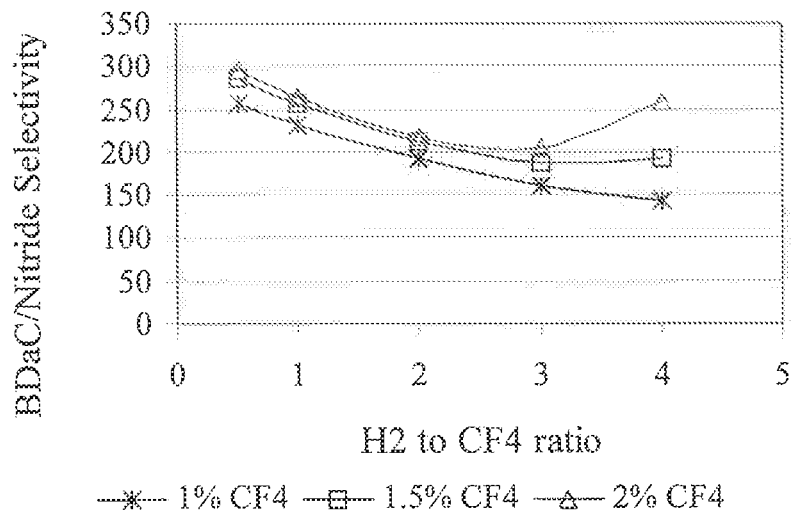
FIG. 7 is a graph depicting the BDaC to silicon nitride selectivity based on the ratio of $H_2$ to $CF_4$ in a $O_2/H_2/CF_4$ plasma blend when varying concentrations of $CF_4$ are used.
Figure 8:
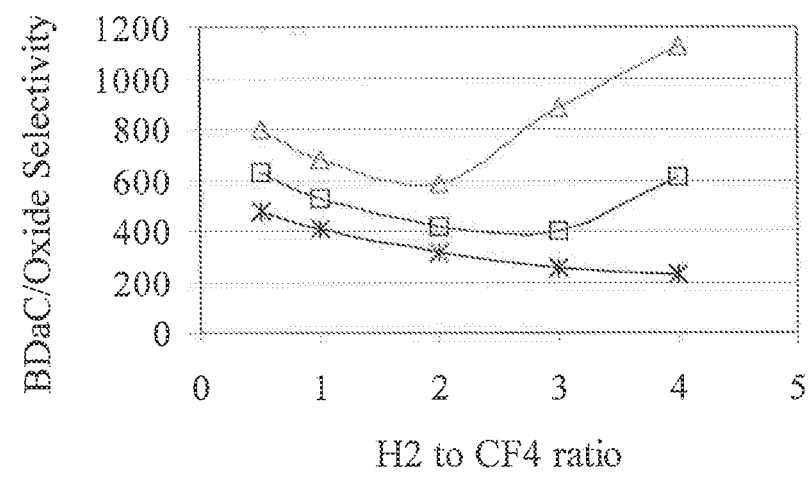
FIG. 8 is a graph depicting the BDaC to silicon oxide selectivity based on the ratio of $H_2$ to $CF_4$ in a $O_2/H_2/CF_4$ plasma blend when varying concentrations of $CF_4$ are used.
Figure 9:
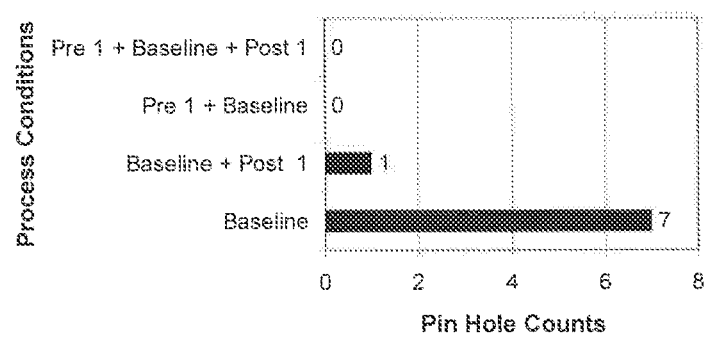
FIG. 9 is a graph showing the effect of pre-mask removal and post-mask removal plasma treatments on the number of pin holes present on exposed SiN film.

Next, the BDaC to silicon nitride selectivity was calculated, as shown in FIG. 7. The processes embodied by the present disclosure are at least 100 times more selective for BDaC than silicon nitride, regardless of the percentage of $CF_4$ gas utilized or the ratio of $H_2$ to $CF_4$. Then, the BDaC to silicon dioxide selectivity was calculated, as shown in FIG. 8. The processes embodied by the present disclosure are at least 200 times more selective for BDaC than silicon dioxide. The higher the percentage of $CF_4$ utilized corresponded with a higher selectivity for BDaC over both silicon nitride and silicon dioxide. Further, the selectivity levels for BDaC over silicon nitride and for BDaC over silicon dioxide were most similar when the $H_2$ to $CF_4$ ratio was about 1 or less and when the $CF_4$ percentage was 1%.

Example 2

As shown in Example 1, although the plasma chemistry of the present disclosure can increase the BDaC etch rate, it can also result in silicon nitride and silicon dioxide etching, which can lead to pinhole formation or other defects in the substrate film due to too much nitride material loss. The effect of the pre-treatment and post-treatment steps discussed above is demonstrated in FIG. 9. Specifically, the substrates treated with the baseline/control gas were treated with an $O_2/H_2/CF_4$ gas mixture for 300 seconds; the substrates treated with the baseline/control and post-treatment gases were treated with an $O_2/H_2/CF_4$ gas mixture for 300 seconds, followed by treatment with an $N_2/H_2$ gas mixture for 60 seconds; the substrates treated with the pre-treatment and baseline/control gases were treated with $O_2$ for 60 seconds, followed by treatment with an $O_2/H_2/CF_4$ gas mixture for 300 seconds; and the substrates treated with the pre-treatment, baseline/control, and post-treatment gases were treated with $O_2$ for 30 seconds, $O_2/H_2/CF_4$ for 300 seconds, and $N_2/H_2$ for 30 seconds. The number of pinholes found on each of the substrates (silicon nitride films) was then counted and compared to a control, where no pre-treatment or post-treatment step was performed. As shown, the pre-treatment and post-treatment steps result in a reduction in the number of pinholes formed in a silicon nitride film. No pinholes were found on the substrate that underwent both pre-treatment and post treatment steps. In addition, no pinholes were found on the substrate that underwent just pre-treatment. One pinhole was found on the substrate that underwent just post-treatment. Meanwhile, seven pinholes were found in a substrate that did not undergo any pre-treatment or post-treatment steps.

These and other modifications and variations to the present invention may be practiced by those of ordinary skill in the art, without departing from the spirit and scope of the present disclosure, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the present disclosure so further described in such appended claims.

What is claimed is:

1. A method for removing a doped amorphous carbon mask from a semiconductor substrate, comprising:
   generating a plasma to be used in treating the substrate, wherein the plasma comprises an oxygen containing gas, a halogen containing gas, and a hydrogen containing gas, wherein the halogen containing gas is present in an amount ranging from about 1% to about 2% based on the total gas volume, wherein the ratio of the amount of hydrogen containing gas to the amount of halogen containing gas in the plasma ranges from about 0.001 to about 1, wherein the plasma is generated in a plasma chamber; and
   treating the substrate to remove the doped amorphous carbon mask by exposing the substrate to neutral particles from the plasma in a downstream processing chamber.

2. The method of claim 1, wherein the oxygen containing gas is $O_2$.

3. The method of claim 1, wherein the halogen containing gas includes fluorine.

4. The method of claim 3, wherein the halogen containing gas is tetrafluoromethane ($CF_4$).

5. The method of claim 1, wherein the hydrogen containing gas is $H_2$.

6. The method of claim 1, wherein the doped amorphous carbon mask is a boron doped amorphous carbon mask or a nitrogen doped amorphous carbon mask.

7. The method of claim 1, wherein the mask removal is carried out at a source power ranging from about 125 watts to about 13,500 watts.

8. The method of claim 1, wherein the mask removal is carried out at a pressure ranging from about 1 milliTorr to about 4000 milliTorr.

9. The method of claim 1, wherein the substrate is exposed to the neutral particles from the plasma at a temperature ranging from about 5° C. to about 300° C.

10. The method of claim 1, wherein the substrate is treated by exposing the substrate to the neutral particles from the plasma for a time period ranging from about 1 second to about 600 seconds.

11. The method of claim 1, wherein the doped amorphous carbon mask is removed at a rate ranging from about 1,000 Ångströms/minute to about 12,000 Ångströms/minute.

12. The method of claim 1, wherein the oxygen containing gas has a flow rate of from about 0.03 standard cubic centimeters per minute per square centimeter of the substrate to about 15 standard cubic centimeters per minute per square centimeter of the substrate.

13. The method of claim 1, wherein the halogen containing gas has a flow rate of from about 0.007 standard cubic centimeters per minute per square centimeter of the substrate to about 0.3 standard cubic centimeters per minute per square centimeter of the substrate.

14. The method of claim 1, wherein the hydrogen containing gas has a flow rate of from about 0.02 standard cubic centimeters per minute per square centimeter of the substrate to about 0.5 standard cubic centimeters per minute per square centimeter of the substrate.

15. The method of claim 1, wherein a pre-treatment gas is applied to the substrate before the substrate is exposed to the neutral particles from the plasma, wherein the pre-treatment gas comprises oxygen, nitrogen, or a combination thereof.

16. The method of claim 15, wherein the pre-treatment gas flow rate ranges from about 0.03 standard cubic centimeters per minute per square centimeter of the substrate to about 15 standard cubic centimeters per minute per square centimeter of the substrate.

17. The method of claim 15, wherein the substrate includes a nitride layer having a critical dimension and an oxide layer having a critical dimension, wherein the method results in a ratio of oxide critical dimension loss to nitride critical dimension loss ranging from about 0.75 to about 1.25.

18. The method of claim 1, wherein a post-treatment gas is applied to the substrate after the substrate is exposed to the neutral particles from the plasma, wherein the post-treatment gas comprises oxygen, nitrogen, or a combination thereof.

19. The method of claim 18, wherein the post-treatment gas flow rate ranges from about 0.03 standard cubic centimeters per minute per square centimeter of the substrate to about 15 standard cubic centimeters per minute per square centimeter of the substrate.

20. The method of claim 1, wherein the substrate is exposed to the neutral particles from the plasma at a temperature ranging from about 15° C. to about 50° C.

21. The method of claim 1, wherein the substrate is not directly exposed to the plasma in the plasma chamber.

* * * * *